United States Patent [19]

Hart

[11] 4,152,574
[45] May 1, 1979

[54] PROTECTIVE BEAM CATCHER FOR ELECTRON BEAM APPARATUS

[75] Inventor: Sigwalt Hart, Munich, Fed. Rep. of Germany

[73] Assignee: Steigerwald Strahltechnik GmbH, Munich, Fed. Rep. of Germany

[21] Appl. No.: 911,583

[22] Filed: Jun. 1, 1978

[30] Foreign Application Priority Data

Jun. 1, 1977 [DE] Fed. Rep. of Germany ....... 2724778

[51] Int. Cl.$^2$ ............................................... B23K 9/00
[52] U.S. Cl. ............................................. 219/121 EB
[58] Field of Search .................. 219/121 EB, 121 EM

[56] References Cited

U.S. PATENT DOCUMENTS

| | | | |
|---|---|---|---|
| 3,472,997 | 10/1969 | El-Kareh et al. ............. | 219/121 EB |
| 3,745,320 | 7/1973 | Baumgärtner ................ | 219/121 EB |

*Primary Examiner*—Bruce A. Reynolds
*Assistant Examiner*—Fred E. Bell
*Attorney, Agent, or Firm*—Edwin E. Greigg

[57] ABSTRACT

To prevent damage to electron beam apparatus from inadvertent exposure of parts of the apparatus to the electron beam, there is provided a beam catcher which has a catcher plate that seals off the evacuated work chamber of the apparatus from a space containing gas under substantially higher pressure than normally prevailing in the work chamber. When the electron beam inadvertently impinges on the beam catcher, it is able to puncture the catcher plate, thereby permitting the gas to pass through the puncture and enter the work chamber, causing defocusing of the electron beam which prevents a progression of the puncture and also causing a pressure increase in the work chamber, resulting in further defocusing of the electron and in automatic shutoff of the accelerating potential.

11 Claims, 3 Drawing Figures

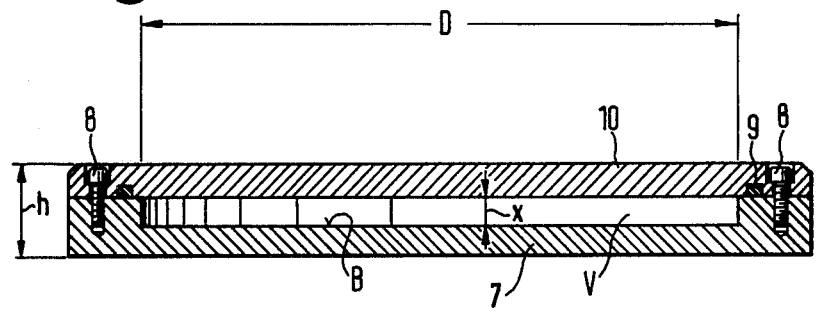
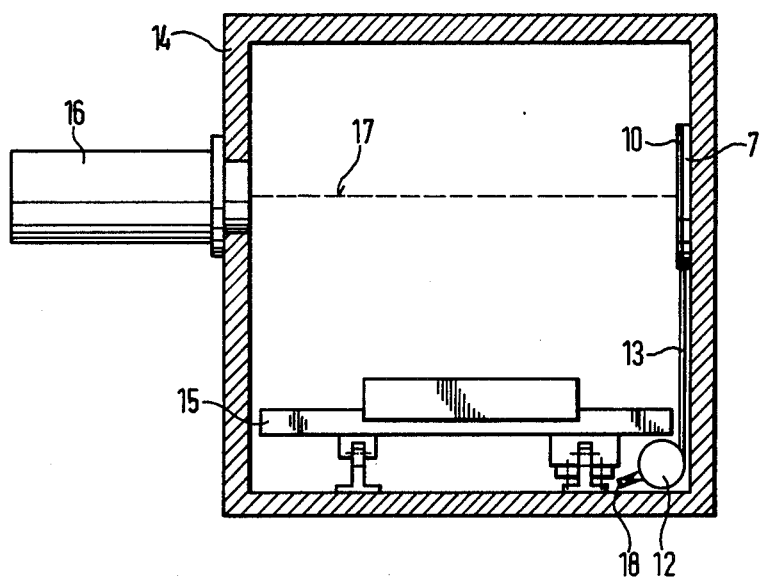

PROTECTIVE BEAM CATCHER FOR ELECTRON BEAM APPARATUS

BACKGROUND OF THE INVENTION

The invention relates to electron beam apparatus. More particularly, the invention relates to a protective shield for use within or without the evacuated target chamber of an electron beam apparatus which is traversed by an electron beam having a high energy density.

The electron beam generated by electron guns operating with a high accelerating potential and at elevated beam intensity, is normally a relatively narrow beam with high energy density, even without electronic focusing. The beam remains narrow and the energy density remains high along the entire path traversed by the beam from the gun to the target chamber. As a consequence, the beam is capable of causing damage or destruction of parts of the apparatus, for example a holding mechanism or the target chamber wall, if it is inadvertently permitted to strike these objects, due to operating errors for example. Damage may still occur even if the impact occurs at a substantially greater distance than the intended target surface.

It is known in the art to provide protection against beam damage by installing relatively thick metal plates as beam catchers. These plates require a relatively large space and thus limit the motion of the workpiece within the target chamber as well as being subject to several other disadvantages.

OBJECT AND SUMMARY OF THE INVENTION

It is thus a principal object of the invention to provide a protective device for association with an electron beam apparatus which prevents damage to the apparatus by direct exposure thereof to the electron beam. It is a further object of the invention to provide a beam protector which requires relatively little space and virtually no servicing. Still another object of the invention is to provide a beam protector which requires no connections with the basic control system of the electron beam apparatus or the electron gun.

These and other objects are attained according to the invention by providing a beam receiver to be placed in the path of the electron beam, the beam receiver including a beam catcher plate which seals the target chamber or work chamber of the electron beam apparatus in air-tight manner with respect to a space containing substantially higher pressure, in particular atmospheric pressure. The invention further provides that the material and the thickness of the catcher plate is such that when it is impinged by the electron beam, there will be formed therein a narrow aperture permitting the flow of gases from the high pressure side to the low pressure side. The catcher plate may be disposed within the work chamber to cover an opening in the work chamber wall while the outside of the opening is covered with a suitable lid, for example a lead plate, while atmospheric pressure is admitted into the space between the catcher plate and the lid.

The protective catcher plate may be made of metal, for example steel, with a transverse extent at least equal to the area within which the electron beam may arrive. The catcher plate and its lid or cover may also define a volume into which an inert gas, for example under atmospheric pressure, is admitted. It is provided according to the invention that when the electron beam impinges on the catcher plate, the latter is locally melted, causing therein the formation of a hole which intentionally permits the flow of air or some other gas into the evacuated work chamber of the apparatus at high velocity, in the opposite direction of the electron beam propagation. Due to the presence of the high speed gas jet emerging from the hole in the catcher plate, the electron beam is dispersed at least over a path of several centimeters, thereby preventing any further enlarging of the hole previously melted into the receiver or catcher plate. Furthermore, due to the admission of gas through the hole, the pressure in the work chamber of the apparatus rises rapidly, thereby further defocusing the electron beam. In addition, the normally provided vacuum control system senses the increasing pressure in the work chamber of the apparatus and can trigger a termination of the beam voltage in the beam source at the same time as it may close a so-called beam value which separates the high vacuum electron gun region from the work chamber and thus prevents damage or destruction of the cathode of the electron gun.

When the catcher plate is made a part of a housing located within the work chamber of the apparatus, the volume of the catcher housing may be so chosen that, after pressure equalization, the pressure within the main work chamber of the apparatus is no higher than necessary to prevent damage to the electron gun even if the above-referred to beam valve fails to close or closes only slowly.

If the work chamber of the apparatus is not large enough to permit the installation of a beam catcher according to the present invention having its own independent volume and permitting a sufficient pressure increase in the chamber, a beam catcher with a reduced volume may be used and connected by means of a suitable tubulation with a supplementary air container of appropriate size which can be disposed elsewhere in the chamber or even outside of the chamber, i.e. wherever a sufficient amount of space is available.

In beam catchers which define an internal volume according to the present invention, it may happen, during long terms of operation, that a small leak in the volume of the beam catcher will cause the interior volume to be evacuated so that no air or gas is available to deflect the beam as it penetrates the protective catcher plate. To prevent this occurrence, the internal beam catcher volume or the supplementary gas container may be provided with an automatic air valve which automatically admits atmospheric air into the interior of the beam catcher whenever the pressure in the main work chamber of the apparatus rises above a certain level.

Any penetrations in the beam catcher plate may be repaired, for example by welding. Alternatively, a new or repaired catcher plate may be exchanged for the damaged plate.

The invention will be better understood as well as further objects and advantages thereof become more apparent from the ensuing detailed description of two preferred embodiments taken in conjunction with the drawing.

BRIEF DESCRIPTION OF THE DRAWING

FIG. 2 is a sectional view of a second exemplary embodiment of the invention; and FIG. 3 is a schematic side view of an electron beam apparatus including a beam catcher according to the present invention.

DESCRIPTION OF THE PREFERRED EMBODIMENTS

Figure 1:
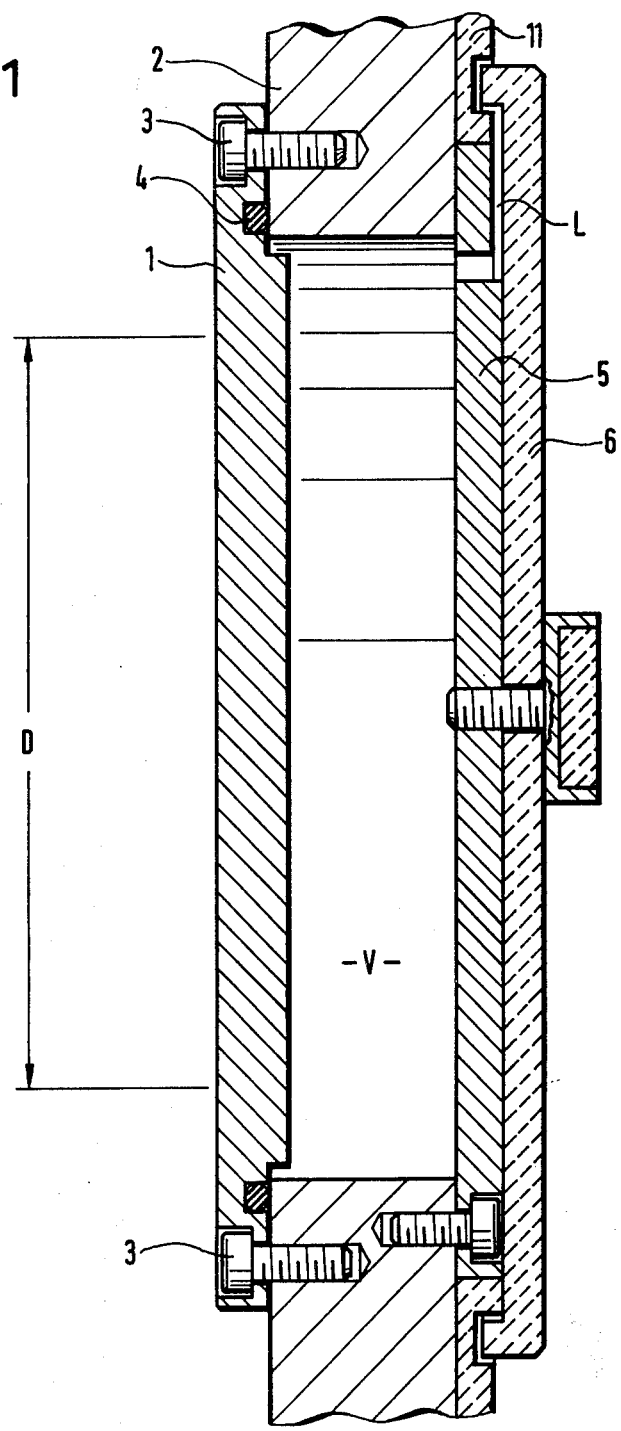
FIG. 1 is a sectional view of a first exemplary embodiment of the beam catcher according to the present invention as installed in the wall of a work chamber of an electron beam apparatus.

The protective beam catcher illustrated in FIG. 1 includes a catcher plate 1 which is illustrated to be mounted over and provide an air-tight seal across an opening in the wall 2 of a vacuum chamber or work chamber of an electron beam system which is not further shown. The catcher plate 1 is shown to be mounted on the wall 2 by means of screws 3 across a vacuum seal 4.

The catcher plate 1 and the opening in the chamber wall 2 are so located as to be in the path of an electron beam generated by an electron gun, not shown. The opening in the chamber wall 2 is closed externally by a shield plate 5 having a lead cover 6 which overlaps an existing lead cover 7 of the chamber wall 2 in such a manner that any X-rays generated by the electron beam cannot exit from the work chamber of the apparatus.

The internal volume V defined by the catcher plate 1 and the shielding plate 5 within the opening of the chamber wall 2 communicates, preferably through a narrow labyrinth L, with the outside of the chamber, normally at atmospheric pressure. Accordingly, the space V is normally at atmospheric pressure and may continue to receive air from the outside if the electron beam melts a hole into the catcher plate 1 within the area defined by the diameter D.

The electron beam system with which the present invention is associated may be a known apparatus for drilling, welding, milling, engraving, or the like, by means of a concentrated electron beam. If the electron beam apparatus is energized inadvertently without the presence of a workpiece or if the workpiece is inadvertently removed from the path of the electron beam, the latter impinges on the catcher plate 1 within the region D and is capable of melting a hole in the plate. As soon as the penetration is complete, air flows through the hole and emerges therefrom at high velocity, in a direction opposite to the direction of propagation of the electron beam, thereby causing the latter to be defocused and preventing any further enlargement of the melted hole. Normally, the vacuum control system associated with commercial electron beam systems will automatically be engaged by the increase of pressure in the work chamber, and will shut off the high voltage supply of the beam source or the electron gun and, at the same time, will close a normally provided beam valve which provides a vacuum-tight seal between the electron gun and the work chamber of the apparatus.

In the second exemplary embodiment of the invention, illustrated in FIG. 2, the beam catcher defines a flat container 7 having a cover 10 which is attached by means of screws 8 across a seal 9 and provides a vacuum-tight internal space V. The distance x between the inside wall of the cover 10 and the base B of the container may be made relatively small, for example 5 mm, so that the height h of the container also remains small, for example approximately 15 mm, with each of the plates defining the cover and the base being steel plates of a thickness of approximately 5 mm. The beam catcher in the present, second embodiment may be installed under normal conditions within the work chamber of the apparatus without seriously limiting the available movement of the workpiece.

A beam catcher similar to that described and illustrated with respect to FIG. 2 is shown installed in an electron beam apparatus in the illustration of FIG. 3. Shown there is a work chamber 14 including an X-Y target table 15 on which a workpiece, not shown, can be located for normal electron beam processing. The system further includes an electron gun 16 which generates a horizontally propagating electron beam 17.

Adjacent to the opposite wall of the chamber 14 there is disposed a catcher housing having a flat container 7 with a vacuum-tight cover 10. In the illustration of FIG. 3, the beam catcher, which is similar to that shown in FIG. 2, is further provided with a connection 13 to a supplementary air container 12. The air container 12 may be equipped with an automatic replenishment valve 18 which insures that, when the pressure in the work chamber 14 rises, the supplementary container 12 and hence the volume V within the beam catcher are replenished with air at atmospheric pressure to counteract the possibility that a portion of the air within the volume V may have been evacuated through an unnoticed small leak caused, for example, by beam impingement in a previous work cycle. It is also possible to dispose either the catcher plate 1 or the beam catcher device illustrated in FIG. 2 at the outside of an opening in the chamber wall in vacuum-tight and easily demountable manner.

If the material and thickness of the catcher plate are suitably chosen, the latter may be mounted directly between the work chamber and the external air space. Under that condition, care must be taken that the hole melted in the catcher plate by the beam is sufficiently long and narrow, i.e. it represents a sufficiently high pressure drop, so that the air flow into the vacuum chamber is not excessively high. Care must also be taken that the emerging electron beam or any X-rays generated thereby do not cause damage to surrounding objects.

The foregoing relates to preferred exemplary embodiments of the invention, it being understood that other embodiments and variants thereof are possible within the spirit and scope of the invention.

What is claimed and desired to be secured by Letters Patent of the United States is:

1. A protective beam catcher for an electron beam apparatus, said apparatus including an evacuated work chamber and an electron beam generator for generating an intense, narrow electron beam which traverses said work chamber, said protective beam catcher comprising:
   a beam catcher plate, disposed in the path of said electron beam, said beam catcher plate constituting a gas seal for isolating said work chamber from a region containing gas under a pressure which is substantially higher than the pressure normally prevailing in said work chamber, the thickness and composition of said beam catcher plate being such that said electron beam is able to cause a puncture in said catcher plate upon direct impingement thereon, causing a gas flow through said puncture toward said electron beam.

2. A protective beam catcher according to claim 1, wherein said work chamber has an opening to the atmosphere generally opposite the location of said beam generator and wherein said beam catcher plate demountably and sealingly obturates said opening.

3. A protective beam catcher according to claim 2, wherein said beam catcher plate is attached to the interior side of the wall of said chamber and wherein there is provided a cover plate for covering said opening from the outside of the wall of said work chamber, said catcher plate and said cover plate defining an interior space which contains gas at higher pressure than that prevailing in the work chamber.

4. A protective beam catcher according to claim 3, wherein said cover plate is covered by a layer of lead to absorb X-radiation.

5. A protective beam catcher according to claim 3 or 4, wherein said interior space communicates with the external air space surrounding said work chamber through a channel having a high resistance to air flow.

6. A protective beam catcher according to claim 1, further comprising a base portion to which said catcher plate is sealingly attached and together with which it defines an interior space containing a gas at higher pressure than the normal pressure in said work chamber.

7. A protective beam catcher according to claim 6, wherein the distance between the inside surfaces of said catcher plate and said base portion is less than 1 cm.

8. A protective beam catcher according to claim 6 or 7, wherein said interior space has a volume such that when the catcher plate is punctured by the electron beam and the pressure in said work chamber and in said interior space are equalized, the equalized pressure is not greater than 10 torr.

9. A protective beam catcher according to claim 6 or 7, further comprising a gas container coupled to said interior space through a tubulation.

10. A protective beam catcher according to claim 9, wherein said gas container is equipped with an automatically acting replenishment valve.

11. A protective beam catcher according to claim 1, further comprising a base portion to which said catcher plate is sealingly attached and together with which it defines an interior space containing a gas at higher pressure than the normal pressure in said work chamber, and still further comprising an automatically acting replenishment valve for providing gas to said interior space.

* * * * *